US012628413B2

(12) United States Patent
Ho et al.

(10) Patent No.: US 12,628,413 B2
(45) Date of Patent: May 12, 2026

(54) SEMICONDUCTOR DEVICE

(71) Applicant: Vanguard International Semiconductor Corporation, Hsinchu (TW)

(72) Inventors: Yu-Hao Ho, Hsinchu City (TW); Cheng-Tsung Wu, Taipei City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 448 days.

(21) Appl. No.: 18/508,258

(22) Filed: Nov. 14, 2023

(65) Prior Publication Data

US 2025/0159973 A1 May 15, 2025

(51) Int. Cl.
*H10D 84/80* (2025.01)
*H10D 84/01* (2025.01)
*H10D 84/03* (2025.01)

(52) U.S. Cl.
CPC ....... *H10D 84/811* (2025.01); *H10D 84/0156* (2025.01); *H10D 84/038* (2025.01)

(58) Field of Classification Search
CPC . H10D 84/811; H10D 84/0156; H10D 84/038
USPC ........................................................ 257/213
See application file for complete search history.

(56) References Cited

U.S. PATENT DOCUMENTS

| | | | | |
|---|---|---|---|---|
| 10,587,114 B2 * | 3/2020 | Kanawati | ............... | H02H 9/046 |
| 10,854,596 B2 * | 12/2020 | Gorbachov | ............... | H03F 1/52 |
| 2009/0079272 A1 | 3/2009 | Ludikhuize | | |
| 2016/0035834 A1 | 2/2016 | Mohai | | |

FOREIGN PATENT DOCUMENTS

| | | |
|---|---|---|
| TW | 201701470 A | 1/2017 |
| TW | 202247462 A | 12/2022 |

OTHER PUBLICATIONS

Hu et al. CN 119630047 A, Semiconductor Device, filed on Sep. 8, 2023 and published Mar. 14, 2025 (Year: 2025).*

* cited by examiner

*Primary Examiner* — Tu-Tu V Ho
(74) *Attorney, Agent, or Firm* — Winston Hsu

(57) ABSTRACT
A semiconductor device includes an epitaxial layer disposed on a substrate, which both have a first conductivity type. A first well region having a second conductivity type is disposed in the epitaxial layer. A gate is disposed on the first well region. A source contact region and a drain contact region both having the first conductivity type are disposed in the first well region. A second well region having the first conductivity type is disposed in the epitaxial layer, laterally abuts the first well region and is in contact with a portion of the substrate. The second well region and the portion of the substrate constitute a resistor that is electrically coupled to a ground terminal. A heavily doped region having the first conductivity type is disposed in the second well region and electrically connected to the source contact region.

15 Claims, 9 Drawing Sheets

SEMICONDUCTOR DEVICE

BACKGROUND OF THE INVENTION

1. Field of the Invention

The present disclosure relates generally to semiconductor devices in a switch circuit, and more particularly to semiconductor devices including a transistor and a resistor connected in series in a high-side drive circuit.

2. Description of the Prior Art

Metal-oxide-semiconductor field-effect-transistors (MOSFETs) are common components used in integrated circuits, and usually used as power switches in various power applications and power supply lines. For example, in a switch circuit (or referred to as a bridge circuit) where switching components are connected in series, MOSFETS are used as switching components and disposed at a high-side circuit and a low-side circuit respectively. The high-side switching component and the low-side switching component are turned on and turned off alternately. In order to prevent the high-side switching component and the low-side switching component from being turned on at the same time to cause a short through circuit, it is usually necessary to provide an additional level shifter to detect the potential signal of the high-side circuit, and then this potential signal is transmitted back to the low-side circuit. When the potential signal of the high-side circuit is detected to have a malfunction, the low-side circuit transmits a signal to shut down the high-side circuit. The additional level shifter is required to be disposed in the current switch circuit. Therefore, the manufacturing cost of the integrated circuit and the size of the chip cannot be effectively reduced.

SUMMARY OF THE INVENTION

In view of this, the present disclosure provides semiconductor device that includes a transistor and a resistor connected in series in a high-side drive circuit to accurately detect a high-side potential signal between a high-side switching component and a low-side switching component. The semiconductor device prevents the high-side switching component and the low-side switching component from being turned on at the same time to cause a short through circuit. Moreover, the transistor and the resistor are formed by using the structure of the high-side drive circuit without increasing in the footprint of the semiconductor device. Therefore, it is conducive to reduce the manufacturing cost and the size of a chip.

According to an embodiment of the present disclosure, a semiconductor device is provided and includes a substrate, an epitaxial layer, a first well region, a gate, a source contact region, a drain contact region, a second well region and a heavily doped region. The substrate has a first conductivity type. The epitaxial layer has the first conductivity type and is disposed on the substrate. The first well region has a second conductivity type and is disposed in the epitaxial layer. The gate is disposed on the first well region. The source contact region and the drain contact region both have the first conductivity type, are disposed in the first well region and located on two sides of the gate respectively. The second well region has the first conductivity type, is disposed in the epitaxial layer, laterally abuts the first well region and is in contact with a portion of the substrate. The second well region and the portion of the substrate constitute a resistor, and the resistor is electrically coupled to a ground terminal. The heavily doped region has the first conductivity type, is disposed in the second well region and electrically connected to the source contact region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
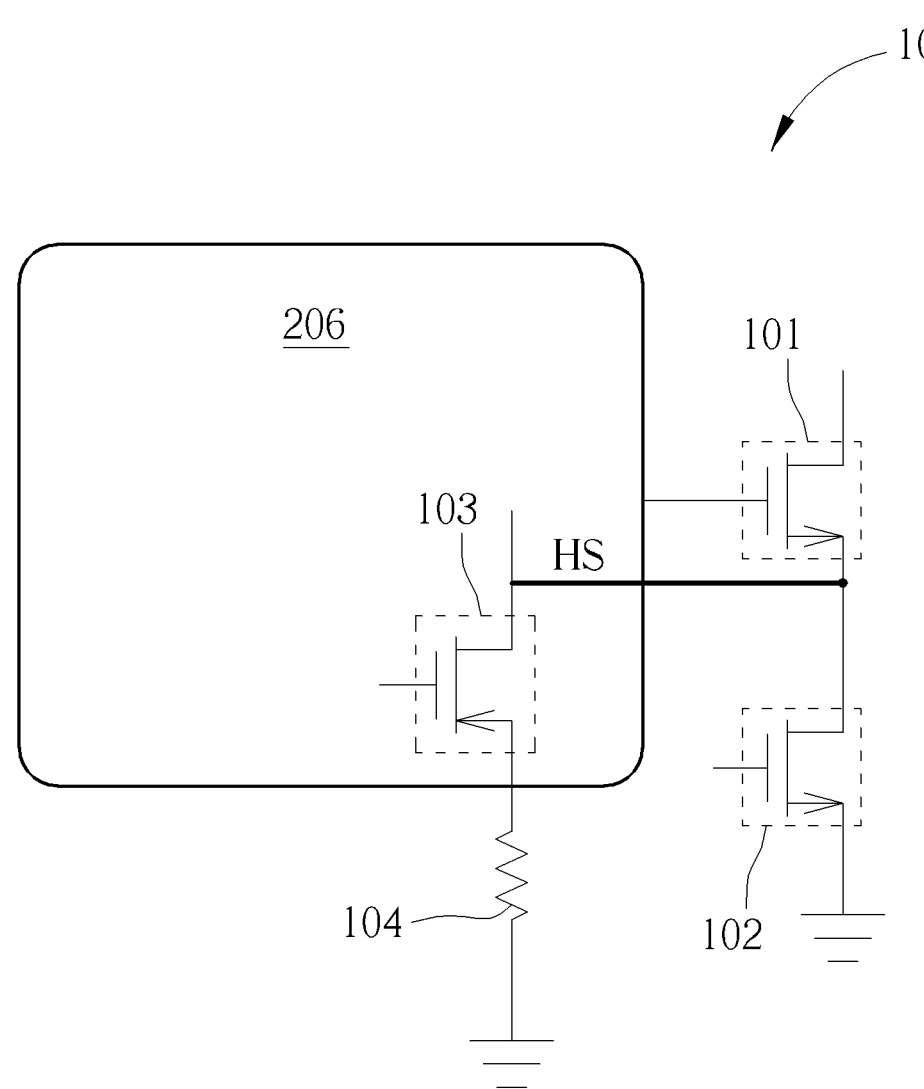
FIG. 1 is a block diagram of a portion of a switch circuit according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 208, 10%, 58, 3%, 28, 18, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a semiconductor device including a transistor and a resistor connected in series in a high-side drive circuit of a switch circuit. The transistor and the resistor are connected in series to accurately detect a high-side potential signal between a high-side switching component and a low-side switching component, thereby preventing the high-side switching component and the low-side switching component from being turned on at the same time to cause a short through circuit. Moreover, the structure of the high-side drive circuit is used to form the transistor and the resistor connected in series without increasing the footprint of the semiconductor device. Therefore, it is beneficial to reduce the manufacturing cost and the size of a chip.

FIG. 1 is a block diagram of a portion 100 of a switch circuit according to an embodiment of the present disclosure. The portion 100 of the switch circuit includes a high-side transistor 101, a low-side transistor 102 and a high-side drive circuit 206. In one embodiment, the high-side transistor 101 and the low-side transistor 102 may both be N-type metal-oxide-semiconductor (NMOS) field-effect-transistors. The high-side transistor 101 is connected to the low-side transistor 102 in series, and the high-side drive circuit 206 is coupled to the high-side transistor 101. According to some embodiments of the present disclosure, the high-side drive circuit 206 includes a third transistor 103 connected to a third resistor 104 in series. The third transistor 103 may be a P-type metal-oxide-semiconductor (PMOS) field-effect-transistor. The third resistor 104 may be a P-type resistor. The node between the high-side transistor 101 and the low-side transistor 102 is coupled to the drain of the third transistor 103. One end of the third resistor 104 is coupled to the source of the third transistor 103, and the other end of the third resistor 104 is coupled to a ground terminal. According to some embodiments of the present disclosure, the third transistor 103 of the P-type transistor and the third resistor 104 of the P-type resistor are configured in the high-side drive circuit 206. A high-side potential signal HS between the high-side transistor 101 and the low-side transistor 102 is accurately detected through the third transistor 103 and the third resistor 104 connected in series. While a malfunction of the high-side potential signal HS is detected, a signal is transmitted from the high-side drive circuit 206 to turn off the high-side transistor 101. Therefore, there is no need to dispose an additional level shifter for preventing the high-side transistor 101 and the low-side transistor 102 from being turned on at the same time to cause a short through circuit.

Figure 2:
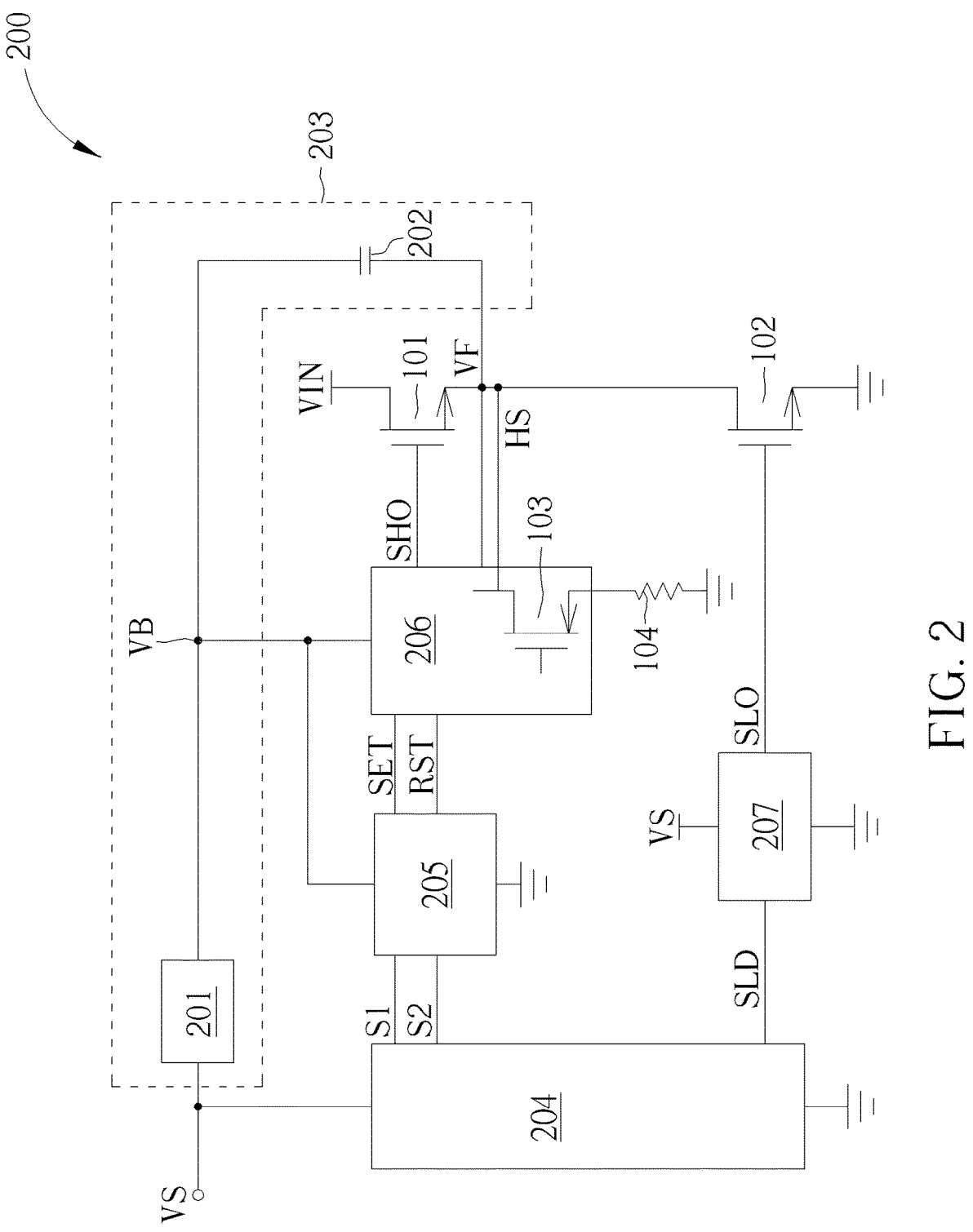
FIG. 2 is a block diagram of a switch circuit according to an embodiment of the present disclosure.

FIG. 2 is a block diagram of a switch circuit 200 according to an embodiment of the present disclosure. The switch circuit 200 includes a high-side transistor 101, a low-side transistor 102, a boost device 203, a level shift circuit 205, a high-side drive circuit 206, a control logic 204 and a low-side drive circuit 207. In some embodiments, the switch circuit 200 may be a half-bridge drive circuit, a switching buck converter, or other switch circuits, where an input voltage VIN of the high-side transistor 101 is greater than a supply voltage VS. The control logic 204 receives the supply voltage VS, and generates a first signal S1 and a second signal S2 according to an input signal to the level shift circuit 205. The level shift circuit 205 is operated between a boosted voltage VB and a ground voltage of a ground terminal, and converts the first signal S1 and the second signal S2 between the supply voltage VS and the ground voltage into a set signal SET and a reset signal RST, respectively, between the boosted voltage VB and a floating reference voltage VF. The high-side drive circuit 206 receives the boosted voltage VB and the floating reference voltage VF, and generates a high-side output signal SHO according to the set signal SET and the reset signal RST to control the high-side transistor 101.

The control logic 204 further generates a low-side driving signal SLD to the low-side drive circuit 207. The low-side drive circuit 207 receives the supply voltage VS and generates a low-side output signal SLO according to the low-side driving signal SLD to control the low-side transistor 102. Under a normal operation, when the low-side drive circuit 207 uses the low-side output signal SLO to control the low-side transistor 102 to be turned on, the high-side drive circuit 206 uses the high-side output signal SHO to control the high-side transistor 101 to be turned off. The node of the floating reference voltage VF is coupled to the ground terminal through the low-side transistor 102, so that the floating reference voltage VF is 0V. When the low-side drive circuit 207 controls the low-side transistor 102 to be turned off, the high-side drive circuit 206 controls the high-side transistor 101 to be turned on and provides the input voltage VIN to the node of the floating reference voltage VF, so that the floating reference voltage VF is equal to the input voltage VIN. Since the high-side transistor 101 and the low-side transistor 102 are the same type components, in order to maintain the same gate-to-source voltage for both the high-side transistor 101 and the low-side transistor 102, the boosted voltage VB is boosted to the sum of the supply voltage VS and the input voltage VIN by using the boost device 203.

The boost device 203 includes a one-way switching component 201 and a capacitor 202. The capacitor 202 is coupled between a node of the boosted voltage VB and a node of the floating reference voltage VF. The one-way switching component 201 is coupled between the supply voltage VS and the node of the boosted voltage VB. While the boosted voltage VB is lower than the supply voltage VS, the one-way switching component 201 provides the supply voltage VS to the node of the boosted voltage VB. While the boost voltage VB is higher than the supply voltage VS, the one-way switching component 201 isolates the supply voltage VS from the node of the boosted voltage VB to prevent an excessive boosted voltage VB from being fed back to the supply voltage VS to damage other circuits.

According to some embodiments of the present disclosure, the third transistor 103 is configured in the high-side drive circuit 206 and connected to the third resistor 104 in series. The high-side drive circuit 206 generates a signal to control the gate of the third transistor 103. The source of the third transistor 103 is coupled to one end of the third resistor 104. The other end of the third resistor 104 is coupled to the ground terminal. The drain of the third transistor 103 receives a high-side potential signal HS between the high-side transistor 101 and the low-side transistor 102. The high-side potential signal HS is accurately detected through the third transistor 103 and the third resistor 104 connected in series. While a malfunction of the high-side potential signal HS is detected, a signal is transmitted through the high-side drive circuit 206 to turn off the high-side transistor 101 to prevent the high-side transistor 101 and the low-side transistor 102 from being turned on at the same time to cause a short through circuit, and thus there is no need to provide an additional level shifter.

Figure 3:
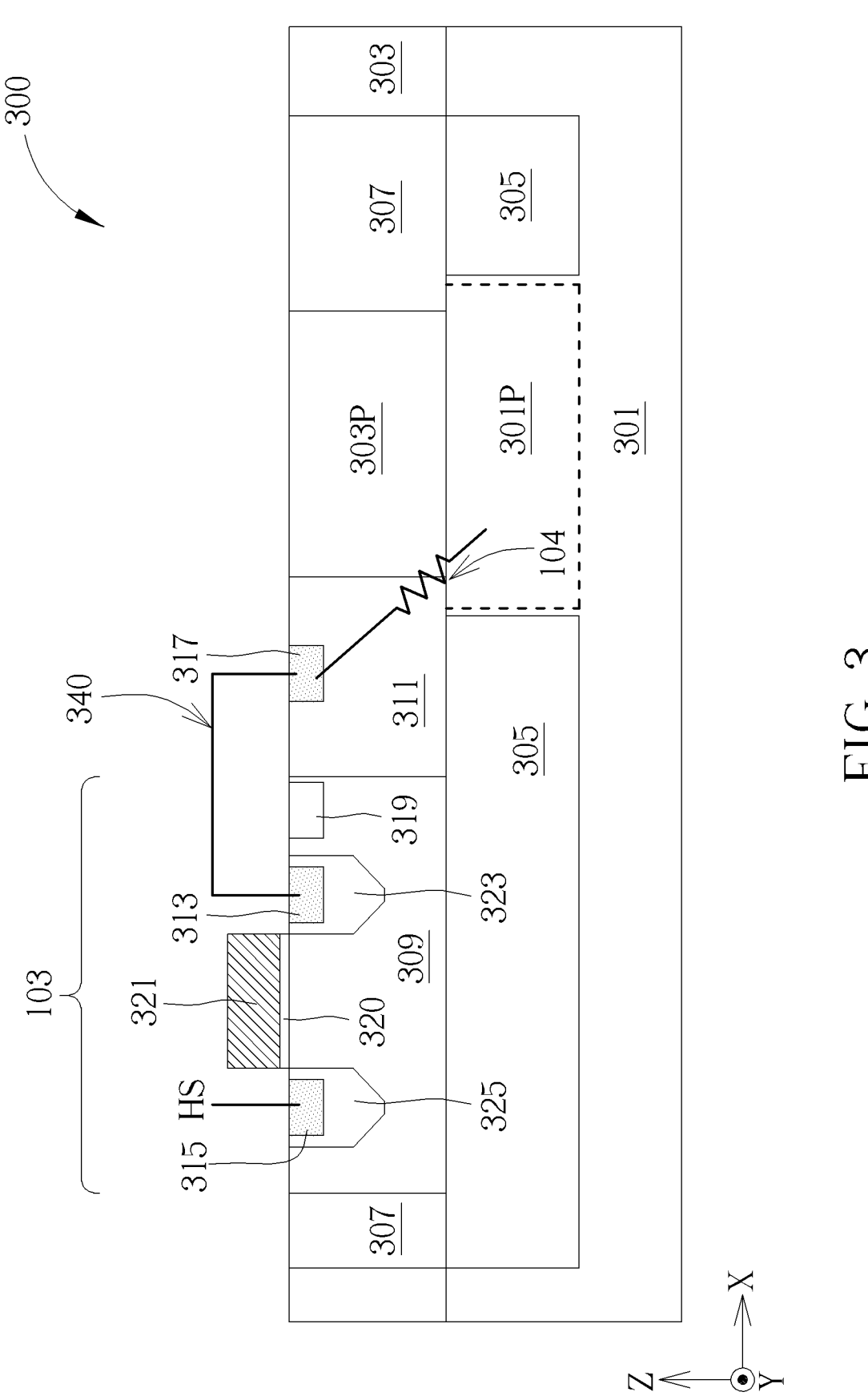
FIG. 3 is a schematic cross-sectional view of a semiconductor device according to an embodiment of the present disclosure.

FIG. 3 is a schematic cross-sectional view of a semiconductor device 300 according to an embodiment of the present disclosure. As shown in FIG. 3, the semiconductor device 300 includes an epitaxial layer 303 stacked and grown on a substrate 301. The substrate 301 and the epitaxial layer 303 both have a first conductivity type, such as a P-type substrate and a P-type epitaxial layer, respectively. In some embodiments, the compositions of the substrate 301 and the epitaxial layer 303 include silicon (Si), silicon carbide (Sic), aluminum nitride (AlN), gallium nitride (GaN) or other suitable semiconductor materials. A first well region 309 having a second conductivity type such as an N-type well region (NW) is disposed in the epitaxial layer 303. A gate 321 is disposed on the first well region 309. A gate dielectric layer 320 is disposed below the gate 321. A source contact region 313 and a drain contact region 315 are disposed in the first well region 309, and located on two sides of the gate 321, respectively. The source contact region 313 and the drain contact region 315 both have the first conductivity type, such as P-type heavily doped regions (P⁺).

As shown in FIG. 3, the semiconductor device 300 further includes a second well region 311 having the first conductivity type, such as a P-type well region (PW), disposed in the epitaxial layer 303. The second well region 311 laterally abuts the first well region 309. In one embodiment, the second well region 311 is in contact with a portion 301P of the substrate. According to some embodiments of the present disclosure, the second well region 311 and the portion 301P of the substrate constitute a third resistor 104. The third resistor 104 may be a P-type resistor, and the third resistor 104 may be electrically coupled to a ground terminal through the substrate 301. In addition, a heavily doped region 317 having the first conductivity type, such as a P-type heavily doped region (P⁺), is disposed in the second well region 311. The heavily doped region 317 may be electrically connected to the source contact region 313 through an interconnection structure 340. In one embodiment, the first well region 309, the source contact region 313, the drain contact region 315 and the gate 321 may constitute a P-type enhancement-mode transistor, and the P-type enhancement-mode transistor corresponds to the third transistor 103 in FIG. 1 and FIG. 2. The drain contact region 315 receives the high-side potential signal HS, and the third transistor 103 of the P-type enhancement-mode transistor is connected to the third resistor 104 of the P-type resistor in series to detect the high-side potential signal HS.

In addition, the semiconductor device 300 includes a first doped region 323 and a second doped region 325 disposed in the first well region 309. The first doped region 323 and the second doped region 325 both have the first conductivity type, such as P-type lightly doped regions. The source contact region 313 is located in the first doped region 323, and the drain contact region 315 is located in the second doped region 325. Moreover, a bulk contact region 319 having a second conductivity type, such as an N-type heavily doped region (N⁺), is disposed in the first well region 309. The bulk contact region 319 is laterally separated from both the source contact region 313 and the first doped region 323.

Still referring to FIG. 3, the semiconductor device 300 further includes a third well region 307 having the second conductivity type, such as a high voltage N-type well region (HVNW), disposed in the epitaxial layer 303. The third well region 307 surrounds first well region 309 and second well region 311. In one embodiment, a portion 303P of the epitaxial layer may be located between the second well region 311 and the third well region 307, and the portion 303P of the epitaxial layer is located directly above the portion 301P of the substrate. The second well region 311 laterally abuts and is in contact with the portion 303P of the epitaxial layer, so that the heavily doped region 317 located in the second well region 311 is coupled to the portion 301P of the substrate through the second well region 311 and the portion 303P of the epitaxial layer, thereby adjusting the resistance value of the third resistor 104. For example, the resistance value of the third resistor 104 may be controlled and adjusted by the planar layout shapes, the areas and the doping concentrations of both the second well region 311 and the portion 303P of the epitaxial layer, thereby satisfying the different electrical requirements of various circuits. In addition, the semiconductor device 300 includes a fourth well region 305 having the second conductivity type, such as a deep high voltage N-type well region (DHVNW), disposed in the substrate 301. The first well region 309, the second well region 311 and the third well region 307 are all located directly above the fourth well region 305, and the fourth well region 305 surrounds the portion 301P of the substrate. In some embodiments, all the bottom surfaces of the first well region 309, the second well region 311 and the third well region 307 may be in contact with the top surface of the fourth well region 305. In other embodiments, both the bottom surface of the first well region 309 and the bottom surface of the second well region 311 are separated from the top surface of the fourth well region 305 by a distance.

Figure 4:
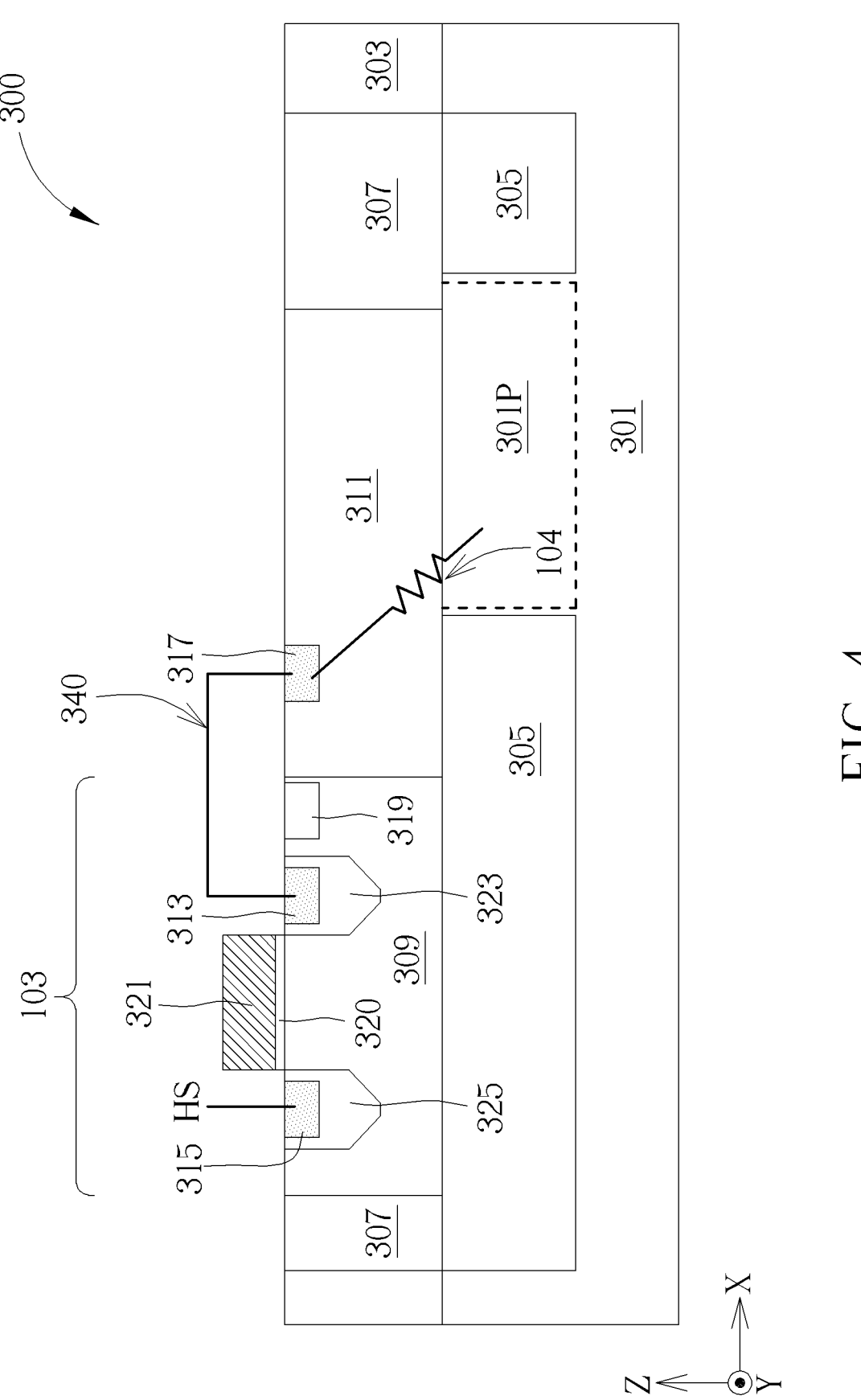
FIG. 4 is a schematic cross-sectional view of a semiconductor device according to another embodiment of the present disclosure.

FIG. 4 is a schematic cross-sectional view of a semiconductor device 300 according to another embodiment of the present disclosure. In the semiconductor device 300 of FIG. 4, the second well region 311 is laterally extended to abut the third well region 307, so that the contact area between the second well region 311 and the portion 301P of the substrate is increased. Therefore, the third resistor 104 of the semiconductor device 300 in FIG. 4 and the third resistor 104 of the semiconductor device 300 in FIG. 3 have different resistance values. In the semiconductor device 300 in FIG. 4, the resistance value of the third resistor 104 may be controlled by the planar layout shape, the area and the doping concentration of the second well region 311. The other features of the semiconductor device 300 in FIG. 4 may refer to the aforementioned description of the semiconductor device 300 in FIG. 3, and are not repeated here.

Figure 5:
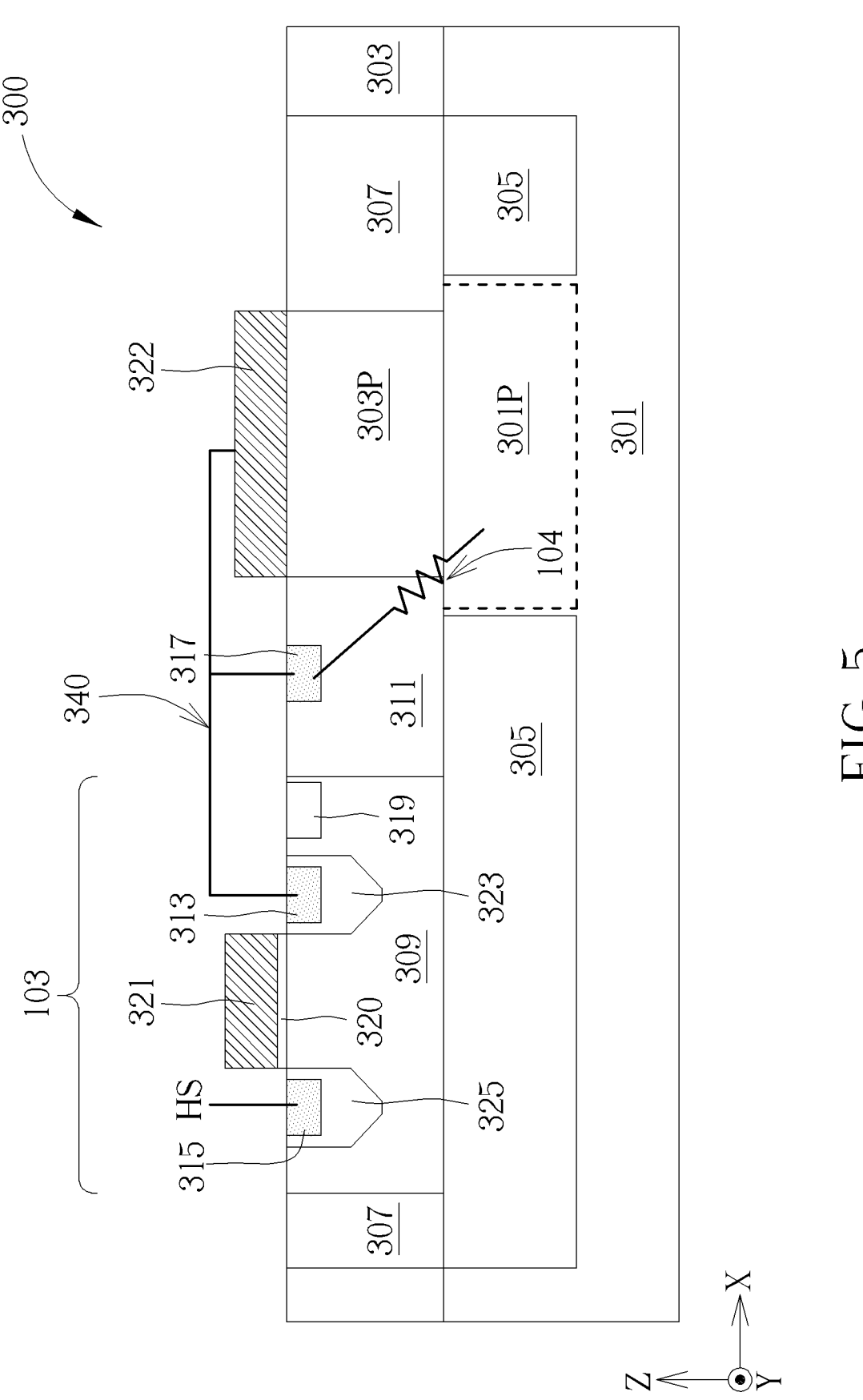
FIG. 5 is a schematic cross-sectional view of a semiconductor device according to further another embodiment of the present disclosure.

FIG. 5 is a schematic cross-sectional view of a semiconductor device 300 according to another embodiment of the present disclosure. In the semiconductor device 300 of FIG. 5, a conductive layer 322 is disposed directly above the portion 303P of the epitaxial layer. The conductive layer 322 may be electrically connected to the heavily doped region 317 and the source contact region 313 through an interconnect structure 340, so that the conductive layer 322 has a shielding effect. The other features of the semiconductor device 300 in FIG. 5 may refer to the aforementioned description of the semiconductor device 300 in FIG. 3, and are not repeated here.

Figure 6:
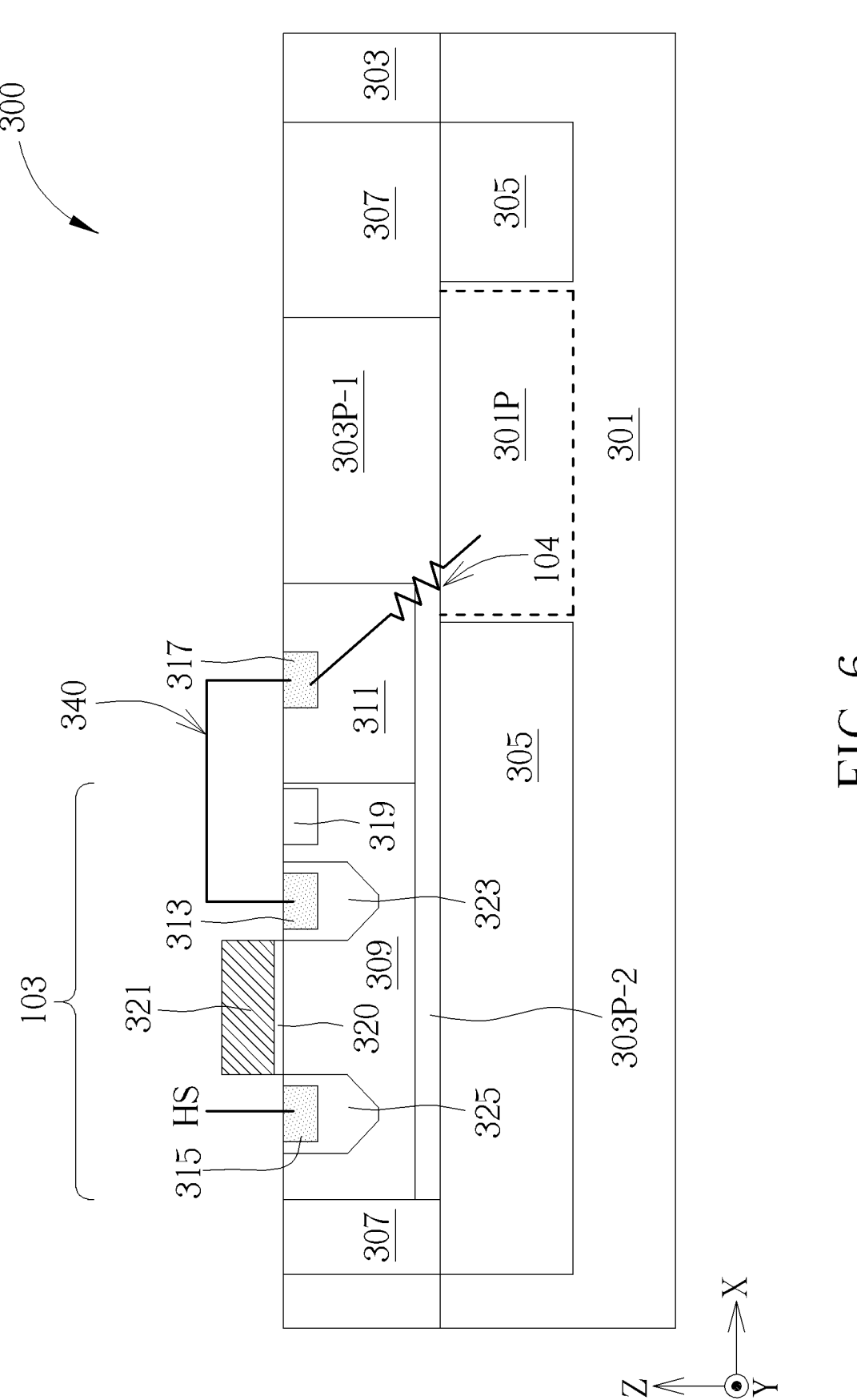
FIG. 6 is a schematic cross-sectional view of a semiconductor device according to another embodiment of the present disclosure.

FIG. 6 is a schematic cross-sectional view of a semiconductor device 300 according to further another embodiment of the present disclosure. In the semiconductor device 300 of FIG. 6, a portion 303P-1 of the epitaxial layer 303 is located between the second well region 311 and the third well region 307. Another portion 303P-2 of the epitaxial layer 303 is located between the bottom surface of the first well region 309 and the top surface of the fourth well region 305, and also between the bottom surface of the second well region 311 and the top surface of the fourth well region 305. In this embodiment, the first well region 309 and the second well region 311 are not in contact with the fourth well region 305. The heavily doped region 317 located in the second well region 311 may be coupled to the portion 301P of the substrate through the second well region 311 and the portion 303P-2 of the epitaxial layer. The second well region 311, the portion 303P-2 of the epitaxial layer and the portion 301P of the substrate constitute the third resistor 104. Furthermore, the resistance value of the third resistor 104 may be controlled and adjusted by the thickness of the portion 303P-2 of the epitaxial layer. The other features of the semiconductor device 300 in FIG. 6 may refer to the aforementioned description of the semiconductor device 300 in FIG. 3, and are not repeated here.

According to some embodiments of the present disclosure, the third transistor 103 in FIG. 3, FIG. 4, FIG. 5 and FIG. 6 may be formed by the structure of a P-type enhancement-mode transistor in the high-side drive circuit 206. In addition, the structure of the high-side drive circuit 206 further includes an isolation ring surrounding the P-type enhancement-mode transistor, and the second well region 311 of the third resistor 104 may be formed by a portion of this isolation ring. The third transistor 103 and the third resistor 104 in these embodiments may be disposed in the layout structure of the high-side drive circuit 206. Moreover, the third transistor 103 and the third resistor 104 connected in series may be simultaneously formed by the process steps of forming the P-type enhancement-mode transistor and the isolation ring in the high-side drive circuit 206. Therefore, there is no need to provide an additional level shifter to detect the high-side potential signal HS. The footprint of the semiconductor devices according to some embodiments of the present disclosure is not increased, and the manufacturing cost and the size of the chip are reduced.

Figure 7:
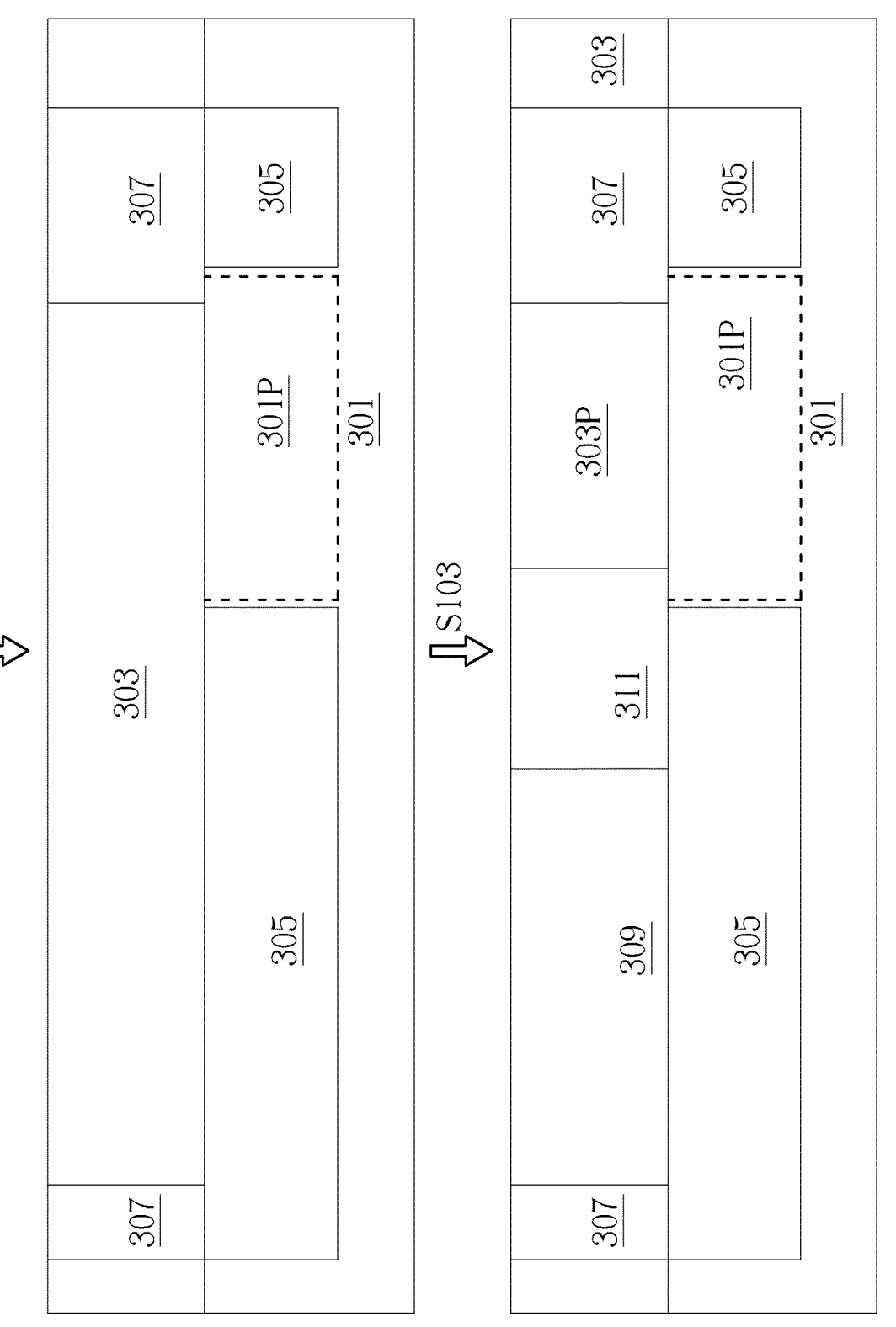
FIG. 7, FIG. 8 and FIG. 9 are schematic cross-sectional views of some stages of a method of fabricating a semiconductor device according to an embodiment of the present disclosure.
Figure 8:
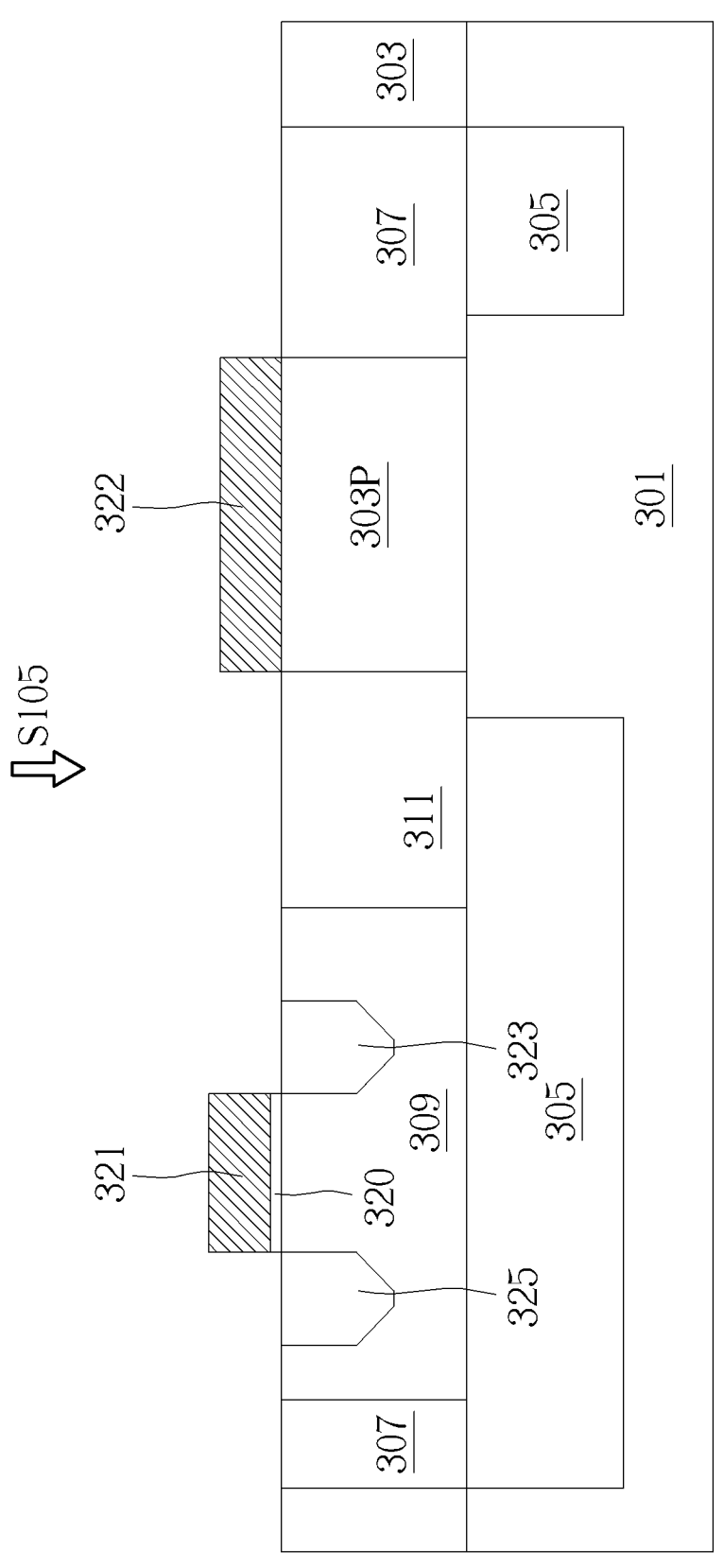
Figure 9:
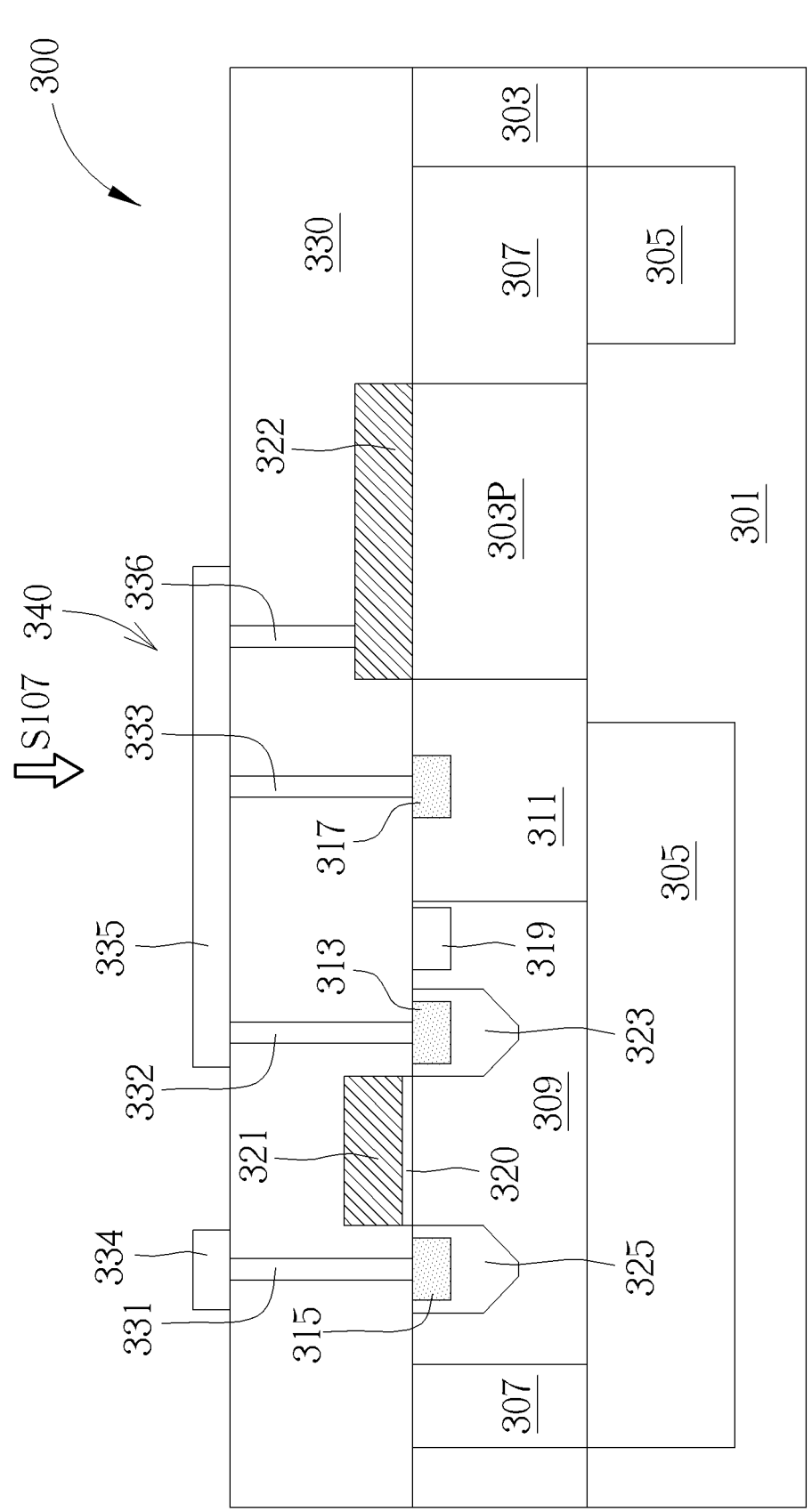

FIG. 7, FIG. 8 and FIG. 9 are schematic cross-sectional views of some stages of a method of fabricating a semiconductor device according to an embodiment of the present disclosure. Referring to FIG. 7, in step S101, firstly, a substrate 301 is provided, such as a P-type semiconductor substrate. The composition of the substrate 301 may be silicon (Si), silicon carbide (SiC) or other suitable semiconductor materials. Then, N-type dopants are implanted in the substrate 301 by an ion implantation process and using a mask to form a fourth well region 305, such as a deep high-voltage N-type well region (DHVNW). The fourth well region 305 surrounds a portion 301P of the substrate. In some embodiments, the doping concentration of the fourth well region 305 is, for example, about 5E14 to about 1E17 cm$^{-3}$. Thereafter, an epitaxial layer 303 such as a P-type epitaxial layer is formed on the substrate 301 by an epitaxial growth process. The composition of the epitaxial layer 303 may be silicon (Si), silicon carbide (SiC) or other suitable semiconductor materials. Next, N-type dopants are implanted in the epitaxial layer 303 by an ion implantation process and using another mask to form a third well region 307, such as a high-voltage N-type well region (HVNW). The third well region 307 is located directly above the fourth well region 305, and the bottom surface of the third well region 307 is in contact with the top surface of the fourth well region 305. The doping concentration of the fourth well region 305 may be higher than the doping concentration of the third well region 307. In some embodiments, the doping concentration of the third well region 307 is, for example, about 1E14 to about 8E16 cm$^{-3}$.

Still referring to FIG. 7, in step S103, N-type dopants are implanted in the epitaxial layer 303 by an ion implantation process and using a mask to form a first well region 309, such as an N-type well region (NW). In some embodiments, the doping concentration of the first well region 309 is, for example, about 5E16 to about 5E17 cm$^{-3}$. The first well region 309 is located directly above the fourth well region 305, and the first well region 309 may laterally abut the third well region 307 located on the left. In some embodiments, the bottom surface of the first well region 309 is in contact with the top surface of the fourth well region 305. In other embodiments, the bottom surface of the first well region 309 is separated from the top surface of the fourth well region 305 by a distance. Afterwards, P-type dopants are implanted in the epitaxial layer 303 by another ion implantation process and using another mask to form a second well region 311, such as a P-type well region (PW). In some embodiments, the doping concentration of the second well region 311 is, for example, about 5E16 to about 5E17 cm$^{-3}$. The second well region 311 is located directly above the fourth well region 305. In some embodiments, the bottom surface of the second well region 311 is in contact with the top surface of the fourth well region 305. In other embodiments, the bottom surface of the second well region 311 is separated from the top surface of the fourth well region 305 by a distance. In addition, the second well region 311 laterally abuts the first well region 309, and a portion 303P of the epitaxial layer is located between the second well region 311 and the third well region 307. Moreover, in some embodiments, the bottom surface of the second well region 311 is in contact with the top surface of the portion 301P of the substrate. In other embodiments, the bottom surface of the second well region 311 is separated from the top surface of the portion 301P of the substrate by a distance.

Next, referring to FIG. 8, in step S105, P-type dopants are implanted in the first well region 309 by an ion implantation process and using a mask to form a first doped region 323 and a second doped region 325, such as P-type lightly doped regions. In some embodiments, the first doped region 323 and the second doped region 325 have the same doping concentration, for example, about 1E16 to about 1E18 cm$^{-3}$. Then, a gate dielectric layer 320 is formed on the first well region 309 by deposition, photolithography and etching processes. The composition of the gate dielectric layer 320 is, for example, silicon oxide. Next, a gate 321 and a conductive layer 322 are formed on the first well region 309 and the portion 303P of the epitaxial layer, respectively, by deposition, photolithography and etching processes. The composition of the gate 321 and the conductive layer 322 is, for example, doped polysilicon. The gate 321 is located between the first doped region 323 and the second doped region 325, and on the gate dielectric layer 320. The bottom surface of the conductive layer 322 may be in contact with the top surface of the portion 303P of the epitaxial layer.

Then, referring to FIG. 9, in step S107, N-type dopants are implanted in the first well region 309 by an ion implantation process and using a mask to form a bulk contact region 319, such as an N-type heavily doped region (N$^+$). In some embodiments, the doping concentration of the bulk contact region 319 is, for example, about 5E18 to about 5E19 cm$^{-3}$. Next, P-type dopants are implanted in the first doped region 323 and the second doped region 325 by another ion implantation process and using another mask to form a source contact region 313 and a drain contact region 315, respectively. At the same time, the P-type dopants are also implanted in the second well region 311 to form a heavily doped region 317. The first doped region 323, the second doped region 325 and the heavily doped region 317 are, for example, P-type heavily doped regions (P$^+$). In some embodiments, the first doped region 323, the second doped region 325 and the heavily doped region 317 have the same doping concentration, for example, about 5E18 to about 5E19 cm$^{-3}$. Afterwards, an interlayer dielectric layer 330 is deposited on the epitaxial layer 303. Then, a drain contact 331, a source contact 332 and vias 333 and 336 are formed in the interlayer dielectric layer 330 by photolithography, etching and deposition processes. The drain contact 331, the source contact 332, the via 333 and the via 336 are electrically connected to the drain contact region 315, the source contact region 313, the heavily doped region 317 and the conductive layer 322, respectively. Next, a drain electrode 334 and a source electrode 335 are formed on the interlayer dielectric 330 layer by deposition, photolithography and etching processes. The drain electrode 334 is electrically connected to the drain contact region 315 through the drain contact 331. The source electrode 335 is electrically connected to the source contact region 313, the heavily doped region 317 and the conductive layer 322 through the source contact 332, the via 333 and the via 336, respectively, to complete the semiconductor device 300 of FIG. 5. The drain electrode 334 receives the high-side potential signal HS. The source of the third transistor 103 is coupled to one end of the third resistor 104 through the source electrode 335, the source contact 332 and the via 333, thereby connecting the third transistor 103 and the third resistor 104 in series.

According to some embodiments of the present disclosure, the fabrication processes of the semiconductor device 300 including the third transistor 103 and the third resistor 104 may be integrated with the fabrication processes of the high-side drive circuit 206 without additional process steps and photo-masks, thereby reducing the cost of fabricating the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, having a first conductivity type;
an epitaxial layer, having the first conductivity type and disposed on the substrate;
a first well region, having a second conductivity type and disposed in the epitaxial layer;
a gate, disposed on the first well region;
a source contact region and a drain contact region, both having the first conductivity type, disposed in the first well region and located on two sides of the gate, respectively;
a second well region, having the first conductivity type, disposed in the epitaxial layer, laterally abutting the first well region and in contact with a portion of the substrate, wherein the second well region and the portion of the substrate constitute a resistor, and the resistor is electrically coupled to a ground terminal; and
a heavily doped region, having the first conductivity type, disposed in the second well region and electrically connected to the source contact region.

2. The semiconductor device of claim 1, further comprising a third well region having the second conductivity type, disposed in the epitaxial layer and surrounding the first well region and the second well region.

3. The semiconductor device of claim 2, wherein a portion of the epitaxial layer is located between the second well region and the third well region, and the portion of the epitaxial layer is located directly above the portion of the substrate.

4. The semiconductor device of claim 3, wherein the second well region laterally abuts and is in contact with the portion of the epitaxial layer.

5. The semiconductor device of claim 3, further comprising a conductive layer disposed directly above the portion of the epitaxial layer, wherein the conductive layer is electrically coupled to the heavily doped region and the source contact region.

6. The semiconductor device of claim 2, wherein the second well region laterally abuts and is in contact with the third well region.

7. The semiconductor device of claim 2, further comprising a fourth well region having the second conductivity type and disposed in the substrate, wherein the first well region, the second well region and the third well region are all located directly above the fourth well region, and the fourth well region surrounds the portion of the substrate.

8. The semiconductor device of claim 7, wherein a bottom surface of the first well region and a bottom surface of the second well region are both in direct contact with a top surface of the fourth well region.

9. The semiconductor device of claim 7, wherein a bottom surface of the first well region and a bottom surface of the second well region are both separated from a top surface of the fourth well region by a distance.

10. The semiconductor device of claim 1, further comprising a first doped region and a second doped region, both having the first conductivity type and disposed in the first well region, wherein the source contact region and the drain contact region are located in the first doped region and the second doped region, respectively.

11. The semiconductor device of claim 10, further comprising a bulk contact region having the second conductivity type, disposed in the first well region, and laterally separated from both the source contact region and the first doped region.

12. The semiconductor device of claim 1, wherein the first well region, the source contact region, the drain contact region and the gate constitute a P-type enhancement-mode transistor, the resistor is a P-type resistor, and the P-type enhancement-mode transistor and the P-type resistor are connected in series.

13. The semiconductor device of claim 12, wherein the P-type enhancement-mode transistor and the P-type resistor are configured in a high-side drive circuit of a switching circuit to detect a high-side potential signal between a high-side transistor and a low-side transistor.

14. The semiconductor device of claim 13, wherein the high-side drive circuit controls the high-side transistor to be turned off according to the high-side potential signal to be detected.

15. The semiconductor device of claim 13, wherein a structure of the high-side drive circuit includes an isolation ring, and the second well region is a portion of the isolation ring.

* * * * *